(12) United States Patent
Petrmichl et al.

(10) Patent No.: US 10,995,400 B2
(45) Date of Patent: *May 4, 2021

(54) METHOD OF MAKING COATED ARTICLE HAVING ANTIBACTERIAL AND/OR ANTIFUNGAL COATING AND RESULTING PRODUCT

(75) Inventors: Rudolph Hugo Petrmichl, Ann Harbor, MI (US); Jiangping Wang, Novi, MI (US); Jason Barber, Ypsilanti, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 59 days.

This patent is subject to a terminal disclaimer.

(21) Appl. No.: 13/271,828

(22) Filed: Oct. 12, 2011

(65) Prior Publication Data
US 2012/0114878 A1     May 10, 2012

Related U.S. Application Data

(63) Continuation-in-part of application No. 12/662,443, filed on Apr. 16, 2010, now abandoned.

(51) Int. Cl.
    *C23C 14/00*     (2006.01)
    *C23C 14/35*     (2006.01)
    (Continued)

(52) U.S. Cl.
    CPC ........ *C23C 14/0036* (2013.01); *C03C 17/245* (2013.01); *C03C 17/27* (2013.01);
    (Continued)

(58) Field of Classification Search
    CPC ............ C03C 25/226; C03C 2218/154; C03C 2218/155; C03C 2218/156; C03C 18/154;
    (Continued)

(56) References Cited

U.S. PATENT DOCUMENTS 6,358,440 B1 *   3/2002   Kawamata et al. .......... 252/584
6,596,399 B2     7/2003   Veerasamy
(Continued)

FOREIGN PATENT DOCUMENTS

JP            63-465        1/1988
WO    WO 2007/087269    8/2007
(Continued)

OTHER PUBLICATIONS

U.S. Appl. No. 12/662,443, filed Apr. 16, 2010, Wang et al.
(Continued)

*Primary Examiner* — Michael A Band

(57) ABSTRACT

Techniques are provided for making a coated article including an antibacterial and/or antifungal coating. In certain example embodiments, the method includes providing a first sputtering target including Zr; providing a second sputtering target including Zn; and co-sputtering from at least the first and second sputtering targets in the presence of nitrogen to form a layer including $Zn_xZr_yN_z$ on a glass substrate. These layers may be heat-treated or thermally tempered to form a single layer including $Zn_xZr_yO_z$. In other examples, two discrete layers of Zn and Zr may be formed. The coating may be heated or tempered to form a single layer including $Zn_xZr_yO_z$. Coated articles made using these methods may have antibacterial and/or antifungal properties.

21 Claims, 9 Drawing Sheets

(51) Int. Cl.
    C23C 14/34     (2006.01)
    C23C 14/06     (2006.01)
    C23C 14/08     (2006.01)
    C03C 17/34     (2006.01)
    C03C 17/245    (2006.01)
    C03C 17/27     (2006.01)
    C23C 14/58     (2006.01)
    A01N 59/16     (2006.01)

(52) U.S. Cl.
    CPC ...... *C03C 17/3423* (2013.01); *C03C 17/3435* (2013.01); *C23C 14/0641* (2013.01); *C23C 14/0676* (2013.01); *C23C 14/08* (2013.01); *C23C 14/083* (2013.01); *C23C 14/086* (2013.01); *C23C 14/3407* (2013.01); *C23C 14/3464* (2013.01); *C23C 14/3492* (2013.01); *C23C 14/35* (2013.01); *C23C 14/352* (2013.01); *C23C 14/5806* (2013.01); *A01N 59/16* (2013.01); *C03C 2217/23* (2013.01); *C03C 2218/154* (2013.01); *C03C 2218/155* (2013.01); *C03C 2218/322* (2013.01)

(58) Field of Classification Search
    CPC . C03C 18/155; C03C 18/156; C03C 17/3435; C03C 17/245; C03C 17/27; C03C 14/3423; C23C 14/0641; C23C 14/0676; C23C 14/0688; C23C 14/08; C23C 14/086; C23C 14/10; C23C 14/5806; C23C 14/3492; C23C 14/3464; C23C 14/083; C23C 14/0036; C23C 14/35; C23C 14/352; C23C 14/3407
    USPC ............ 204/192.12, 192.15, 298.12, 298.18, 204/298.1
    See application file for complete search history.

(56) References Cited

U.S. PATENT DOCUMENTS

| | | | |
|---|---|---|---|
| 6,881,487 B2 | 4/2005 | Lin | |
| 7,172,681 B2* | 2/2007 | Sato | B32B 25/04 156/281 |
| 7,537,801 B2 | 5/2009 | Veerasamy et al. | |
| 7,566,481 B2 | 7/2009 | Veerasamy | |
| 7,592,068 B2 | 9/2009 | Disteldorf et al. | |
| 7,622,161 B2 | 11/2009 | Veerasamy | |
| 7,645,487 B2 | 1/2010 | Petrmichl et al. | |
| 2004/0151942 A1 | 8/2004 | Anzaki et al. | |
| 2006/0189132 A1* | 8/2006 | Iwabuchi et al. | 438/683 |
| 2006/0198903 A1 | 9/2006 | Storey et al. | |
| 2007/0254163 A1 | 11/2007 | Veerasamy et al. | |
| 2008/0251120 A1* | 10/2008 | Malmstrom | H01L 31/02242 136/256 |
| 2009/0162695 A1 | 6/2009 | Hevesi et al. | |
| 2009/0324990 A1 | 12/2009 | Pilloy et al. | |
| 2011/0256408 A1 | 10/2011 | Wang et al. | |

FOREIGN PATENT DOCUMENTS

| | | |
|---|---|---|
| WO | WO 2008/010883 | 1/2008 |
| WO | WO 2009/007448 | 1/2009 |
| WO | WO 2011/129882 | 10/2011 |

OTHER PUBLICATIONS

"Study of Electrical and Optical Properties of Zr-Doped ZnO Thin Films Prepared by DC Reactive Magnetron Sputtering"; Yadav et al., Advanced Materials Research, vol. 62 (2009) pp. 166-166.

"Failure Analysis of Nanocrystals Embedded High-k Dielectrics for Nonvolatile Memories", Yang et al., IEEE 46th Annual International Reliability Physics Symposium, 2008; pp. 46-49.

"Nonvolatile Memories with Dual-Layer Nanocrystalline ZnO Embedded Zr-Doped HfO$_2$ High-k Dielectric", Lin et al., Electrochemical and Solid State Letters, 13 (2010), pp. H83-H86.

"Influence of Annealing Temperature on the Properties of ZnO: Zr Films Deposited by Direct Current Magnetron Sputtering", Zhang et al., Vacuum 84 (2010) pp. 833-836.

"Effect of RF Power on the Properties of Transparent Conducting Zirconium-Doped Zinc Oxide Films Prepared by RF Magnetron Sputtering", Mao-Shui et al., Chinese Physics, vol. 16, No. 2, Feb. 2007, pp. 548-552.

Mexican Office Action dated Jun. 12, 2017 and Translation of Application No. MX/a/2012/011974.

* cited by examiner

| Sample | Anti-bacterial (JIS) | | | | Anti-fungal (ASTM) |
|---|---|---|---|---|---|
| | E. Coli | | S. Aureusi | | |
| | Reduction % | R | Reduction % | R | |
| Clear glass | 0 | 0 | 0 | 0 | 4 |
| Silver | >99.99 | 6.22 | >99.99 | 3.90 | 1-2 |
| $Zn_x Zr_y O_z$ | >99.99 | 5.31 | >99.99 | 3.23 | 0 |

Figure 2

METHOD OF MAKING COATED ARTICLE HAVING ANTIBACTERIAL AND/OR ANTIFUNGAL COATING AND RESULTING PRODUCT

This application is a continuation-in-part (CIP) of U.S. application Ser. No. 12/662,443, filed on Apr. 16, 2010 now abandoned, the entire contents of which are hereby incorporated herein by reference.

Certain example embodiments of this invention relate to a method of making a coated article having an antifungal/antibacterial coating supported by a substrate, and the resulting coated article product. Coated articles according to certain example embodiments of this invention may be used for windows, table tops, picture frame covers, furniture glass, and/or the like.

BACKGROUND AND SUMMARY OF EXAMPLE EMBODIMENTS OF THE INVENTION

Vehicle windows (e.g., windshields, backlites, sunroofs, and sidelites) are known in the art. For purposes of example, vehicle windshields typically include a pair of bent glass substrates laminated together via a polymer interlayer such as polyvinyl butyral (PVB).

Insulating glass (IG) windows are also known in the art. Conventional IG window units include at least first and second glass substrates (one of which may have a solar control coating on an interior surface thereof) that are coupled to one another via at least one seal(s) or spacer(s). The resulting space or gap between the glass substrates may or may not be filled with gas and/or evacuated to a low pressure in different instances. Many IG units are tempered. Thermal tempering of the glass substrates for such IG units typically requires heating the glass substrates to temperature(s) of at least about 580 degrees C. for a sufficient period of time to enable thermal tempering. Monolithic architectural windows for use in homes or building are also known in the art. Fixture windows in homes such as shower stall windows may be made of glass sheets. Again, monolithic windows are often thermally tempered for safety purposes.

Other types of coated articles also are sometimes subjected to heat treatment (HT) (e.g., tempering, heat bending, and/or heat strengthening) in certain applications. For example and without limitation, glass table tops, picture frame covers, and the like may be subject to HT in certain instances.

Germs are becoming of increasing concern across the world, especially in view of the large amount of international travel taking place in today's society. There exists a need in the art for coated articles for use in windows, table tops, and/or the like that are capable of killing germs, viruses, and/or bacteria, thereby reducing the likelihood of persons becoming sick. It also would be advantageous if such characteristics of a coated article could be combined with scratch resistant features.

It will be appreciated that there exists a need in the art for a coated article (e.g., for use in a window, shower door, and/or table-top glass) having antifungal and/or antibacterial properties. It also may also be desirable for the coated article to have scratch resistance properties. Furthermore, it would be desirable to provide a coated article that is both scratch resistant and can function to kill certain bacteria and/or fungus which come into contact with the coated article thereby reducing the chances of persons becoming sick.

Certain example embodiments of this invention relate to a method of making a coated article having antifungal/antibacterial properties, and/or the resulting product. In certain example non-limiting embodiments, there is provided a method of making a coated article (e.g., window such as for a vehicle or building, shower door window, bus window, subway car window, table top, picture frame cover, or the like) that may be capable of being heat treated so that after being heat treated (HT) the coated article is scratch resistant to an extent more than uncoated glass, as well as more resistant to bacterial and fungal growth than uncoated glass. The coated article may or may not be heat treated in different embodiments of this invention.

In certain example embodiments of this invention, $ZrO_2$ and ZnO are co-sputtered on a glass substrate to form a layer comprising zinc zirconium oxide (e.g., $Zn_xZr_yO_z$). The glass substrate may or may not be provided with a barrier layer provided between the glass substrate and the layer comprising zinc zirconium oxide. For example and without limitation, the thin barrier layer may comprise silicon nitride, silicon oxide, and/or silicon oxynitride. The co-sputtered zinc zirconium oxide based layer may be provided directly on the glass substrate, or on the glass substrate over other layer(s) such as the barrier layer. While the substrate may be of glass in certain example embodiments of this invention, other materials such as quartz may instead be used for substrates in alternative embodiments. The coated articles described herein may or may not be thermally tempered and/or patterned in certain example embodiments of this invention. Additionally, it will be appreciated that the word "on" as used herein (e.g., a layer "on" something) covers both direct and indirect contact, e.g., a layer "on" another layer with other layer(s) possibly being located therebetween.

In certain example embodiments, there is provided a method of making a coated article, the method comprising: providing a first sputtering target comprising Zr; providing a second sputtering target comprising Zn; and co-sputtering at least the first and second sputtering targets to form a layer comprising a nitride of Zr doped with Zn on a glass substrate, wherein the layer comprises from about 0.25% to 20% (atomic) Zn. The layer of or including the nitride of Zr doped with Zn may then be heat treated (e.g., thermally tempered), which causes the layer to transform into a layer comprising or based on zinc zirconium oxide (e.g., $Zn_xZr_yO_z$).

In certain example embodiments, the zirconium oxide in the layer comprising zinc zirconium oxide is substantially crystalline, and amorphous zinc oxide is "hidden" in a zirconium oxide (e.g., $ZrO_2$) matrix, and, for example, can release gradually to the surface such that the coating has lasting antimicrobial properties. The zirconium oxide (e.g., $ZrO_2$) matrix may be cubic or substantially cubic, with its structure such that it permits zinc particles to migrate or diffuse therethrough to the exterior surface of the coating over long periods of time. When the zinc particles reach the exterior surface of the coated article in a substantially continuous manner over time, they function to kill at least some bacteria and/or fungi that may come into contact with the zinc, or proximate the zinc, on the surface of the coated article.

In certain example embodiments, the zinc is protected from the environment by a porous layer(s) provided over the layer comprising zinc zirconium oxide (e.g., $Zn_xZr_yO_z$). In different example embodiments, the zinc zirconium oxide (e.g., $Zn_xZr_yO_z$) inclusive layer may comprise, consist essentially of or consist of Zn, Zr and O.

In order to achieve the structure desired in certain example embodiments, the zinc or zinc oxide can be "hidden" in a skeleton or matrix of zirconium oxide. In order to "hide" the zinc or zinc oxide in this manner, the coating can be co-sputtered (or sputtered from a single, mixed target, in certain instances) in a controlled way as follows.

In a first example embodiment, the zinc is sputtered from an angled target. More specifically, a Zr inclusive target is substantially perpendicular to the substrate, and a Zn inclusive target is offset from normal by an angle theta (θ). This position assists forming a layer with zinc or zinc oxide "hidden" in a zirconium oxide based matrix, and helps maintain the stability of the crystalline formation in the coating after optional heat-treatment. As used herein, "Zr target" includes a target comprising zirconium and/or zirconium oxide, and "Zn target" includes a target comprising zinc and/or zinc oxide. In certain example embodiments, a Zr target may comprise or consist essentially of Zr, and a Zn target may comprise or consist essentially of Zn. There may be small amounts of other elements included in each target.

In a second example embodiment, the coating is deposited via power controlled co-sputtering. In this embodiment, the Zr and Zn targets can be substantially parallel or angled from each other, but are sputtered using different amounts of power to control the composition and crystallinity of the coating in a desirable manner.

In a third example embodiment, one target may comprise zirconium and zinc (and possibly oxides of one or both) in a ratio which operates to help control the composition and crystallinity of the coating. For example, the target may contain a patched or other pattern of zirconium and zinc to ensure that each respective element is deposited in the desired amount, and is in substantially crystalline form (or in a formation that is conducive to becoming crystalline upon heat treatment). The target may comprise any pattern that would create the appropriate ratio and structure when sputtered.

The deposition method of zirconium and/or zinc oxide(s) is not limited to the above embodiments. Any other deposition method that would create and maintain a matrix of or based on $Zn_xZr_yO_z$, in the appropriate ratio, may be used. Moreover, the first, second and third embodiments may or may not be used in combination with each other herein.

In certain example embodiments, co-sputtered zirconium and zinc oxides result in a zinc zirconium oxide-inclusive layer that exhibits excellent scratch resistance, combined with antibacterial and/or antifungal properties. It can reduce the likelihood of visible scratching up to a 20 pound load when abraded with a ⅛ inch borosilicate sphere, so that the product is more scratch resistant than is a similar product absent the coating.

In certain example embodiments of this invention, a method of making a coated article is provided. A first sputtering target comprising Zn, and a second sputtering target comprising Zr are provided. A first discrete layer comprising Zn is formed on a glass substrate via the first sputtering target. A second discrete layer comprising Zr is formed over and contacting the layer comprising Zn. The first and second discrete layers are heat treated (e.g., together at substantially the same time) to produce a single layer comprising $Zn_xZr_yO_z$.

In certain example embodiments of this invention, a method of making a coated article is provided. A first sputtering target comprising Zr and a second sputtering target comprising Zn are provided. At least the first and second sputtering targets are co-sputtered in the presence of nitrogen to form a layer comprising $Zn_xZr_yN_z$ on a glass substrate. The layer comprising $Zn_xZr_yN_z$ is heat treatable such that, when heat treated, the layer comprising $Zn_xZr_yN_z$ forms a layer comprising $Zn_xZr_yO_z$ having antimicrobial and/or antifungal properties.

In certain example embodiments of this invention, a method of making a coated article is provided. A first sputtering target comprising Zn, and a second sputtering target comprising Zr are provided. Sequentially sputtering is performed from at least the first and second sputtering targets onto a glass substrate to form at least a first layer comprising Zn having a thickness of from about 20 to 50 Å, and a second layer comprising Zr located directly on the first layer comprising Zn and having a thickness of from about 100 to 250 Å. The Zr is sputtered in the presence of nitrogen. The glass substrate is heat treatable with said first and second layers thereon to form a layer comprising zinc zirconium oxide with antibacterial and/or antifungal properties on the coated article.

In certain example embodiments of this invention, there is provided a method of making a coated article comprising a glass substrate supporting a coating. The coating is sputter deposited on the substrate, with the coating comprising an anti-microbial material located within a carrier material. The anti-microbial material comprises Zn, Ag, and/or Cu. The carrier material comprises Zr, Si, Ti, Hf, and/or Al. The sputter depositing is practiced by either (a) co-sputtering from two or more targets, or (b) sputtering from a mixed metal target.

These features, aspects, advantages, and example embodiments may be used separately and/or applied in various combinations to achieve yet further embodiments of this invention.

BRIEF DESCRIPTION OF THE DRAWINGS

These and other features and advantages may be better and more completely understood by reference to the following detailed description of exemplary illustrative embodiments in conjunction with the drawings, of which:

FIG. 2 is a table comparing antimicrobial properties of co-sputtered zinc zirconium oxide to those of silver, a conventional antimicrobial coating material, and uncoated glass, according to an example embodiment of this invention.

DETAILED DESCRIPTION OF EXAMPLE EMBODIMENTS OF THE INVENTION

Figure 1:
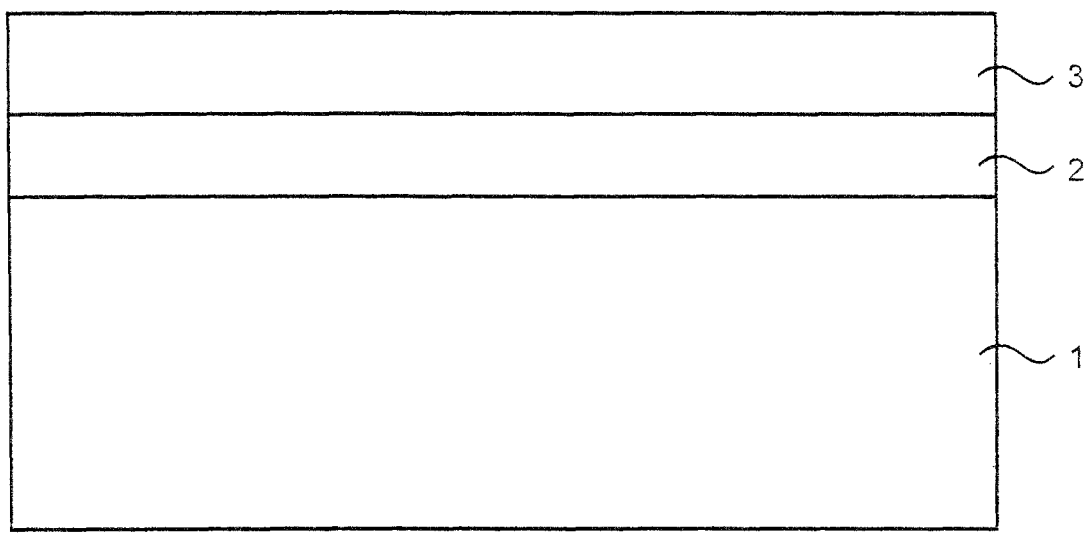
FIG. 1 is a cross-sectional view of an antimicrobial coating according to an example embodiment of this invention.
Figure 3:
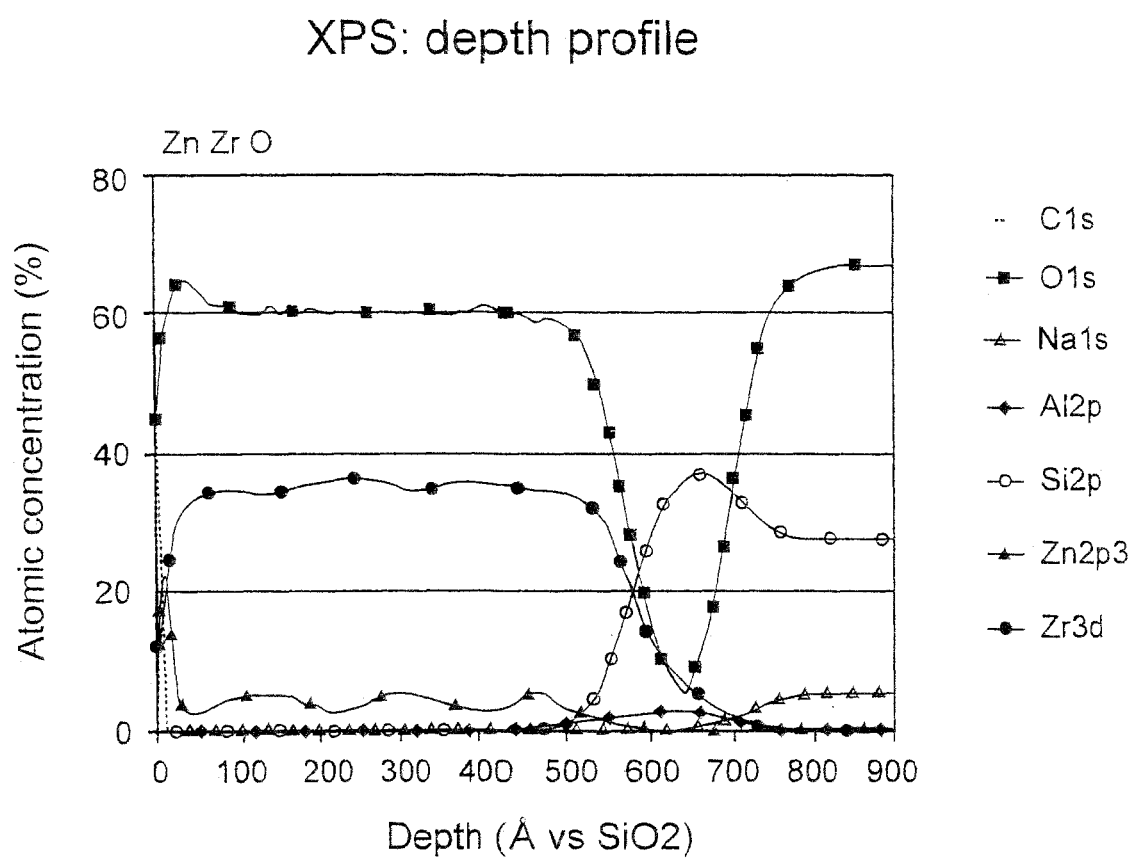
FIG. 3 is an XPS depth profile graph of an example composition of a zinc zirconium oxide-inclusive layer according to an example embodiment of this invention.
Figure 4:
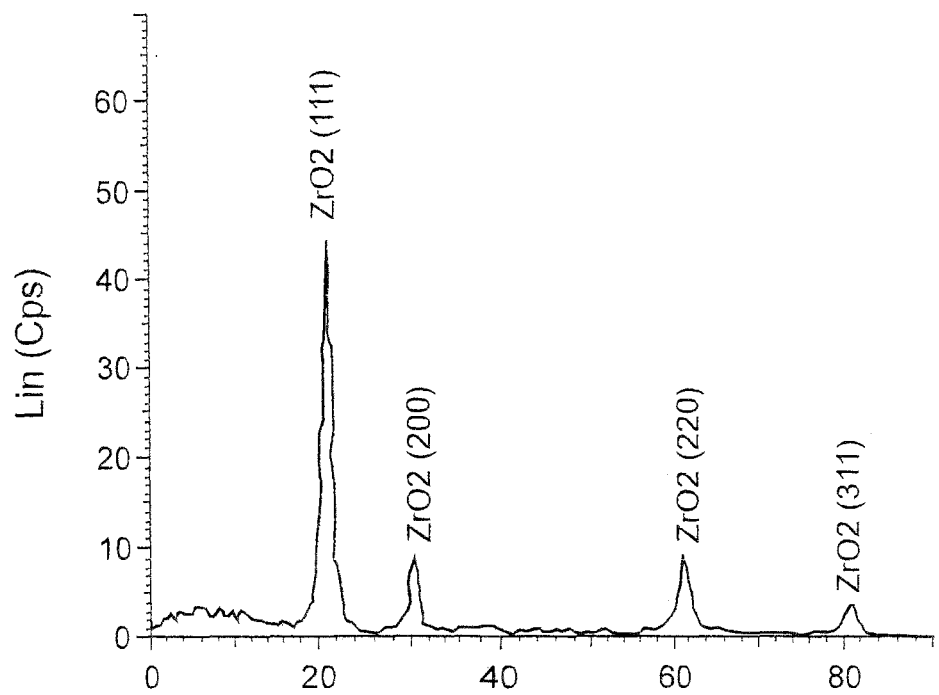
FIG. 4 is an XRD of the crystallinity of an example zinc zirconium oxide-based layer after heat treatment/thermal tempering according to an example embodiment of this invention.

In certain example embodiments of this invention, $ZrO_2$ and ZnO are co-sputtered on a glass substrate 1 to form a layer comprising zinc zirconium oxide 3 which can be the outermost layer of a coated article. The glass substrate may or may not be provided with a barrier layer 2 thereon, with the barrier layer being optionally located between the glass substrate 1 and the layer antibacterial and/or antimicrobial layer comprising zinc zirconium oxide 3. For example and without limitation, this thin barrier layer 2 may comprise silicon nitride, silicon oxide, and/or silicon oxynitride in example embodiments. The co-sputtered zinc zirconium oxide-based layer 3 may be provided directly on the glass substrate 1, or on the glass substrate 1 over other layer(s) such as the barrier layer 2. While the substrate 1 may be of glass in certain example embodiments of this invention, other materials such as quartz, plastics, and/or the like may instead be used for substrates in alternative embodiments. The coated article described herein may or may not be thermally tempered and/or patterned in certain example embodiments of this invention.

Silver is a known antibacterial agent. However, its antifungal properties are not necessarily as desirable as some other materials. For example, compared to silver, $ZrO_2$/ZnO (e.g., forming a $Zn_xZr_yO_z$-based layer) according to certain example embodiments of this invention can possess comparable antibacterial properties and good antifungal properties. Thus, improved antifungal properties may be provided in certain example embodiments of this invention.

In certain example embodiments, the layer 3 may originally be deposited as of or including Zn—ZrN, which is zirconium nitride doped with Zn. For example, the zirconium nitride can be doped with from about 0.25% Zn, more preferably from about 0.25% to 15% Zn, more preferably from about 1-15% Zn, more preferably from about 1-10% or 1-5% Zn. Then, when the glass substrate 1 supporting the Zn—ZrN coating is thermally tempered (e.g., heat treated at temperatures of at least about 580 degrees C., or more preferably at least about 600 degrees C.), the Zn—ZrN would transform into Zn—$ZrO_2$ or possibly another form of zirconium oxide doped with the same amounts of Zn discussed above. In certain example embodiments, a layer comprising Zn—ZrN and/or ZnZrNx may advantageously have an improved mechanical and/or chemical durability prior to heating. In further examples, the tempering window (e.g., temperature and/or duration, etc.) may be wider, with respect to the absence/reduction of visible haze.

In certain example embodiments, when heated, a layer comprising Zn—ZrN and/or ZnZrNx may also result in formation of a $Zn_xZr_yO_z$-based layer 3 according to example embodiments of this invention. Of course, the layer 3 may originally be deposed as $Zn_xZr_yO_z$ or Zn—$ZrO_2$ in certain example embodiments of this invention.

There are two major industrial standards for testing antimicrobial properties of an article. The tests are the JIS Z 2801 test (which tests antibacterial properties), and the ASTM G21 test (which tests antifungal properties). The JIS Z 2801 test uses a value referred to as "R" to evaluate the antibacterial properties of the material being tested. The R value of the surface or article being tested is the log of the ratio of microbe concentration(s) on coated and uncoated products. For example (and without limitation), if R=2, this means that the microbe concentration at the end of the test is 100× less on the coated product than on the uncoated product. R=2 and higher is defined as biocidal. In an ASTM G21 test, the fungal growth is rated from 0-4. 0 is defined as substantially no fungal growth, 1 is defined as traces of growth (less than 10%), 2 is defined as light growth (10-30%), 3 is defined as medium growth (30-60%), and 4 is defined as heavy growth (60% to complete coverage).

An antimicrobial and/or antibacterial layer comprising zinc zirconium oxide 3 according to certain example embodiments is surprisingly advantageous, in that it has been found that the layer can kill at least about 80%, more preferably at least about 90%, and most preferably at least about 99.99% E. Coli (R=5.31), and at least about 80%, more preferably at least about 90%, and most preferably at least about 99.94% S. Aureusi (R=3.23) in a JIS test. Moreover, in an antifungal (ASTM) test, it shows substantially no growth. The rating of a $Zn_xZr_yO_z$ based layer 3 made according to certain example embodiments is substantially 0. This surprising and advantageous result indicates that the zinc zirconium oxide-inclusive layer 3 allows substantially no fungal growth, as opposed to materials such as silver, which earn between 1 and 2 on the ASTM scale (up to 30% growth). Table 1 compares the antifungal and antimicrobial properties of $Zn_xZr_yO_z$ based layer 3 to those of silver and glass.

TABLE 1

| Sample | Antibacterial (JIS) | | | | Antifungal (ASTM) |
| --- | --- | --- | --- | --- | --- |
| | E. Coli | | S. Aureusi | | |
| | Reduction % | R | Reduction % | R | |
| Clear Glass | 0 | 0 | 0 | | 4 |
| Silver | >99.99 | 6.22 | >99.99 | 3.50 | 1-2 |
| Average of ZnZrOx | >99.99 | 5.31 | 99.94 | 3.23 | 0 |
| ZnZrOx/glass | 99.99 | 5.01 | | | 0 |
| ZnZrOx/SiNx | | | 99.89 | 2.95 | 0 |
| ZnZrOx/ZrO2 | >99.99 | 6.22 | 99.99 | 3.90 | |
| ZnZrOx/SnOx | | | 99.95 | 3.30 | 0 |

In certain example embodiments, the zinc in the $Zn_xZr_yO_z$ based layer 3 is protected from the environment by a porous layer(s) provided over the zinc zirconium oxide-based layer. Also in certain example embodiments, a thin barrier layer 2 such as silicon nitride, silicon oxide, and/or silicon oxynitride may be provided underneath the zinc zirconium oxide-based layer 3 to reduce and sometimes even prevent alkali migration from the glass substrate 1 into the coating during optional heat treatment.

In certain example embodiments, zirconium oxide in the layer 3 is crystalline, and amorphous zinc oxide is "hidden" in a zirconium oxide (e.g., $ZrO_2$) matrix in layer 3, and, for example, can release gradually to the exterior surface of layer 3 such that the coating has lasting antimicrobial properties. The zirconium oxide (e.g., $ZrO_2$) matrix may be cubic or substantially cubic, with its structure such that it permits zinc particles to migrate or diffuse therethrough to the exterior surface of the layer 3 over periods of time. When the zinc particles reach the surface of the coated article in a substantially continuous manner over time, they function to kill at least some bacteria and/or fungi that may come into contact with the zinc, or proximate the zinc, on the surface of the coated article.

In order to "hide" the zinc oxide in this manner, the zinc zirconium oxide-based layer 3 may be co-sputtered (or sputtered from a mixed, single target, in different instances) in a controlled way according to certain example embodiments. As used herein, "co-sputtered" may refer to substantially simultaneous sputtering from at least two targets.

The sputtering target(s) discussed below in the example embodiments can be planar target(s), rotating cylindrical magnetron target(s), or a combination thereof. Metal or ceramic targets may be used.

Figure 5:
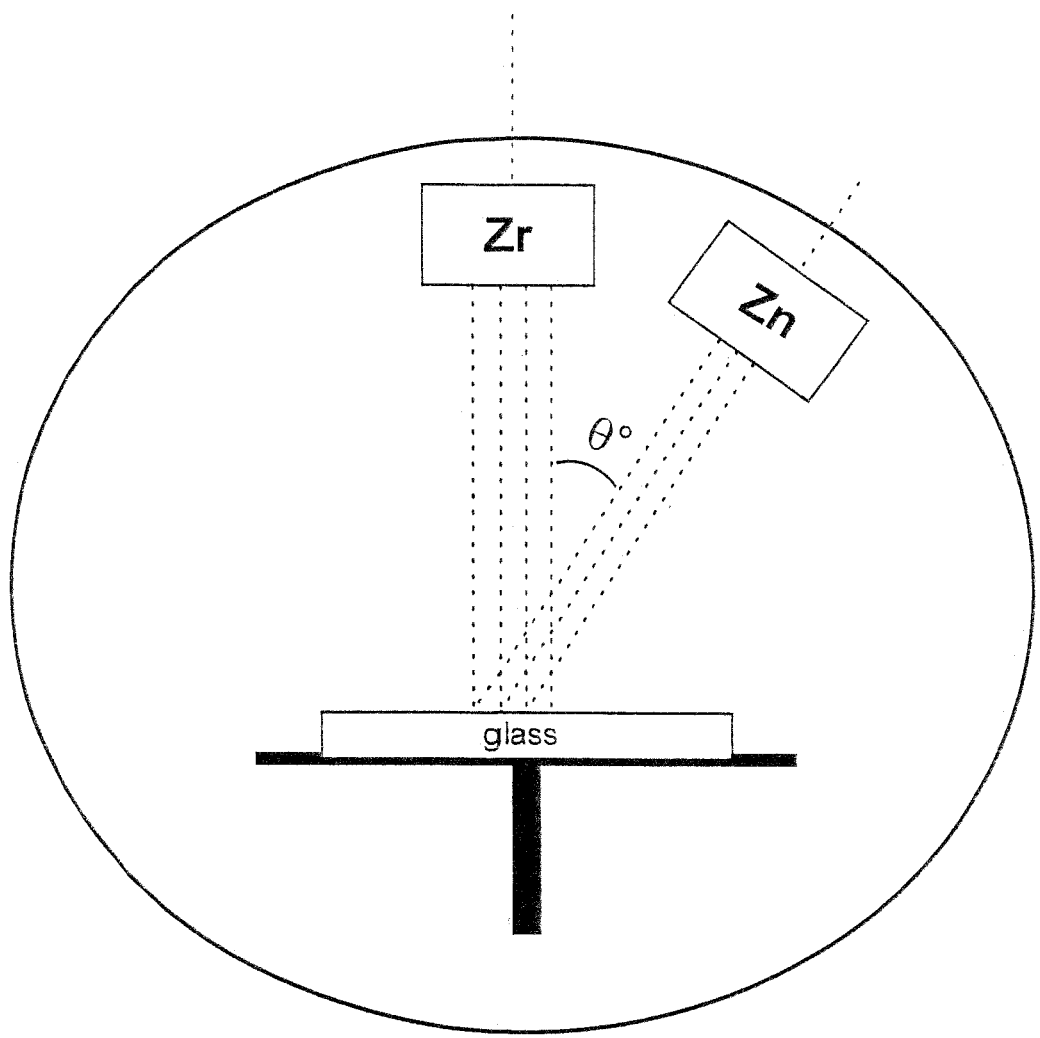
FIG. 5 shows an angled Zn target according to an example embodiment of this invention.
Figure 6:
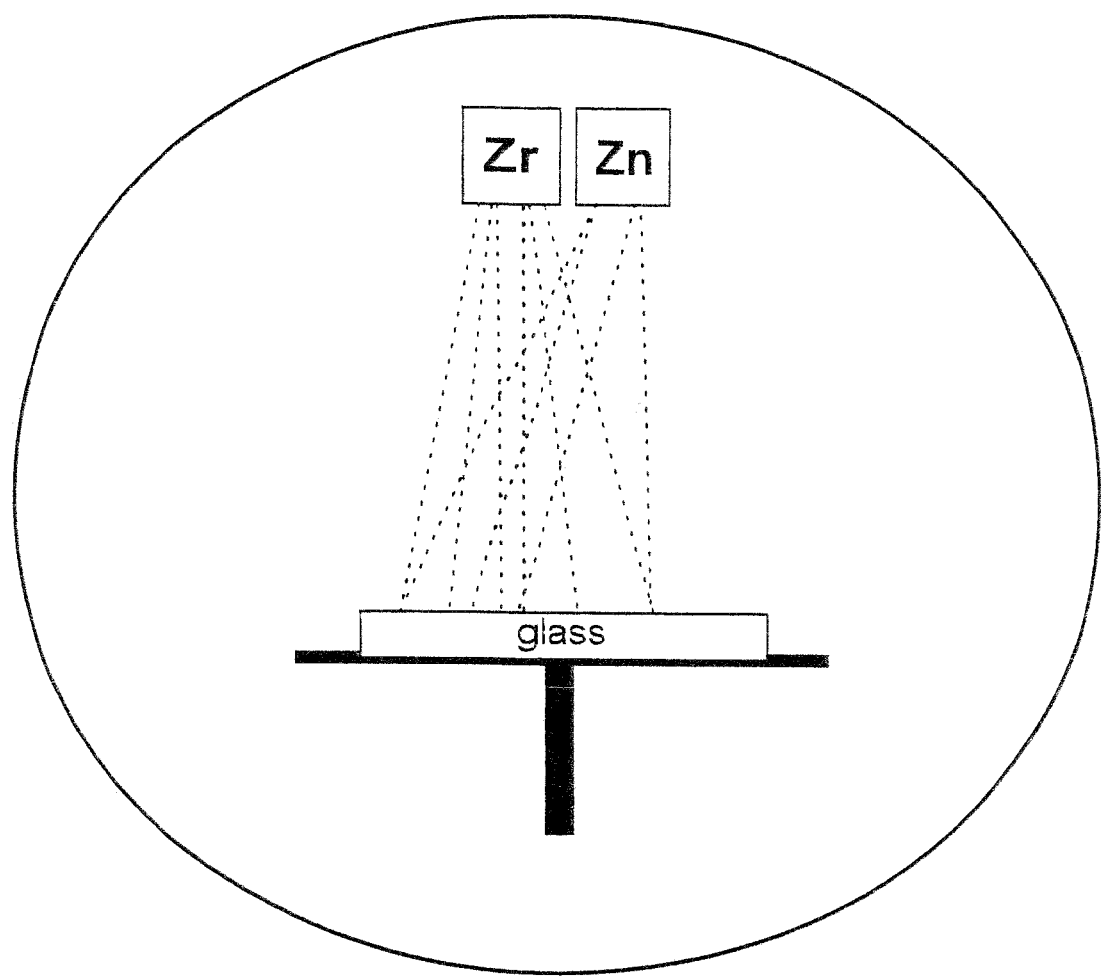
FIG. 6 shows power-controlled co-sputtering from both Zn and Zr targets according to another example embodiment of this invention.
Figure 7:
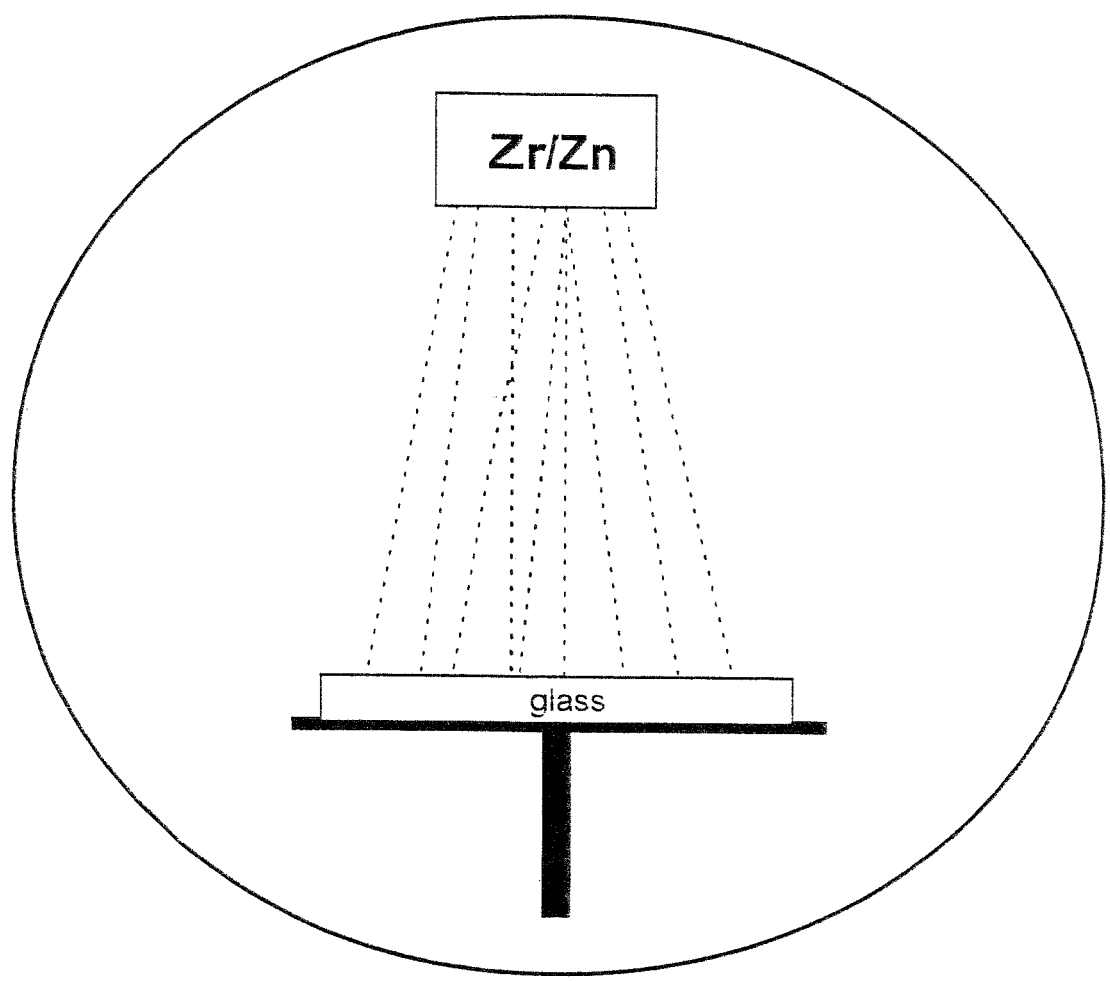
FIG. 7 shows sputtering zinc and zirconium from a single, patched target, according to another example embodiment of this invention.

In a first example embodiment, the zinc is sputtered from an angled target. An example of this is shown in FIG. 5. More specifically, the Zr target is substantially perpendicular to the substrate, and the Zn target is offset by an angle of theta ($\theta$), as shown in FIG. 5. This position assists in forming a layer 3 with zinc oxide "hidden" in a zirconium oxide matrix, and helps maintain the stability of the crystalline formation in the coating after optional heat-treatment. As used herein, "Zr target" includes a target comprising zirconium and/or zirconium oxide, and "Zn target" includes a target comprising zinc and/or zinc oxide. Moreover, there may be small amounts of other elements included in each target.

The angle theta ($\theta$), between the Zr and Zn targets, as shown in FIG. 5, is from about 0 to about 60 degrees, more preferably from about 10 to about 50 degrees, and most preferably from about 30 to about 45 degrees. This can be accomplished by leaving the Zr target substantially perpendicular to the plane of the substrate 1, and tilting the Zn target such that the angle between the two targets is theta ($\theta$), as shown in FIG. 5. In certain example embodiments the aforesaid ranges result in a good overlap of Zn and Zr particles in layer 3, which in turn forms a well-mixed zirconium oxide matrix in which zinc oxide is "hidden."

In a second example embodiment, the coating is deposited via power controlled co-sputtering. In this embodiment, the Zr and Zn targets may or may not be substantially parallel, and are sputtered using different powers to control the composition and crystallinity of the layer 3 in a desirable manner.

For example, in certain non-limiting embodiments, in depositing layer 3 the power used with the Zn target is from about 0.6 to 4.6 kW, more preferably from about 1.6 to 3.6 kW, most preferably from about 2.1 to 3.1 kW, with an example value of 1.6 kW. For the Zr target, the power used in depositing layer 3 can be from about 0.5 to 4.5 kW, preferably from about 1.5 to 3.5 kW, more preferably from about 2.0 to 3.0 kW, with an example value of 1.5 kW. The power of each target may be substantially constant throughout deposition, or may be varied.

In a third example embodiment, one target used in depositing layer 3 may comprise zirconium and zinc (and possibly oxides of each) in a certain ratio that operates to help control the composition and crystallinity of the layer 3. For example, the target may contain a patched pattern of zirconium and zinc to ensure that each respective element is deposited in the desired amount, and is in substantially crystalline form (or in a formation that is conducive to becoming crystalline upon heat treatment). The target may also comprise any pattern that would create the appropriate ratio and structure when sputtered. The first, second, and third embodiments described herein may or may not be used in combination with each other.

Figure 8:
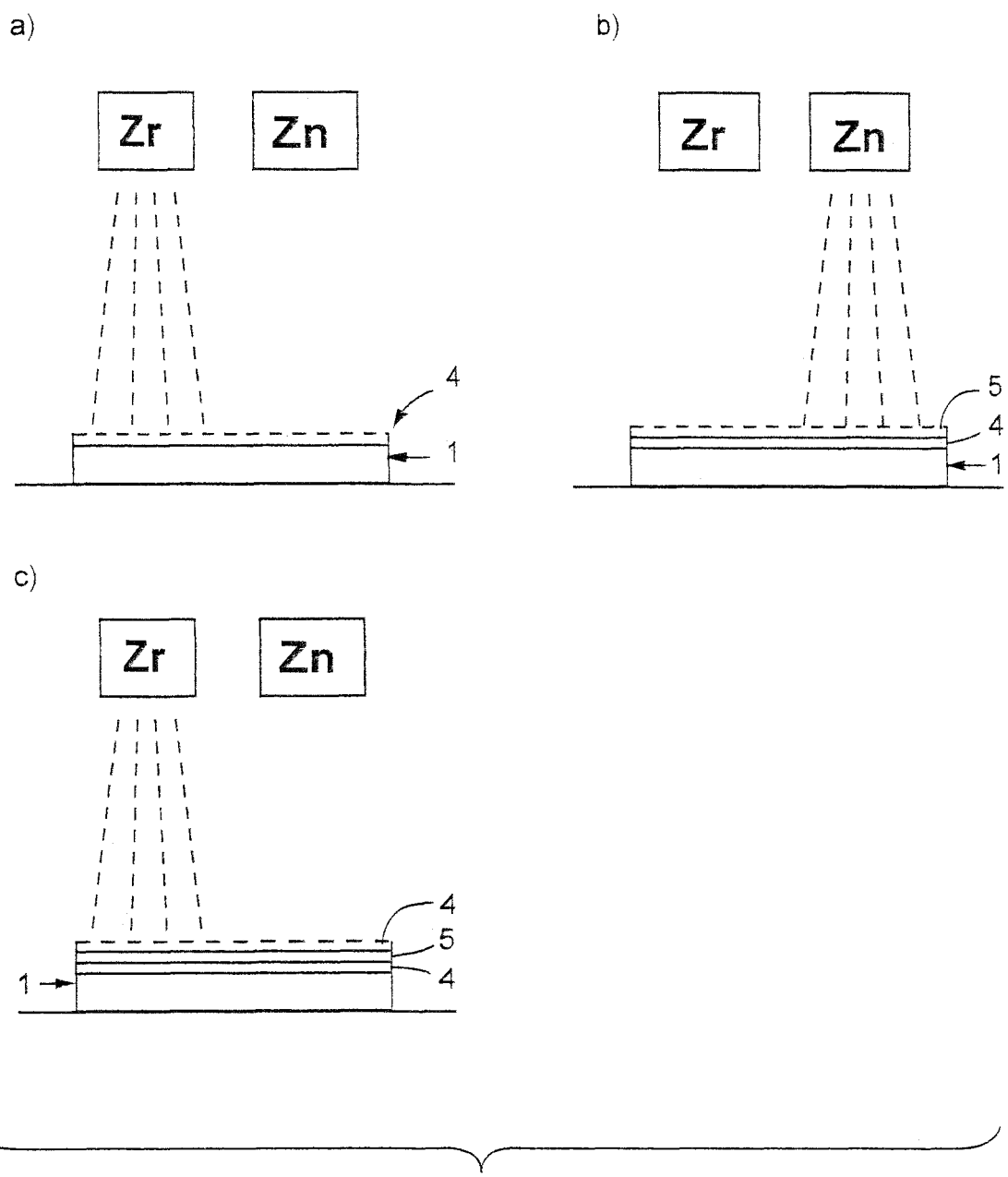
FIGS. 8a, 8b, and 8c show an example of sequential sputtering, according to yet another example embodiment.

Another example embodiment includes sequential sputtering from separate Zn and Zr targets. In this embodiment, thin, alternating layers of zirconium (or zirconium oxide) and zinc (or zinc oxide) may be formed. For example, in FIG. 8a a zirconium oxide based layer 4 is sputtered first on the glass substrate 1. Then, in FIG. 8b a zinc oxide based layer 5 is sputtered second. FIG. 8c illustrates an example of then sputtering zirconium a second time to form another zirconium oxide layer over the zinc oxide layer 5. FIGS. 8a, 8b, and 8c represent discrete layers formed by sequential sputtering prior to heat treatment as an example only; and the order in which these layers are sputtered can be altered. In this embodiment, the discrete layers are formed prior to thermal tempering. It is possible that the zinc can be sputtered first in other example embodiments. During thermal tempering, there can be migration or diffusion between the layers of the FIG. 8 embodiment. With the approach described herein, it is possible that interdiffusion between discrete layers 4, 5 during tempering/heat treatment can result in a coating with the desired antimicrobial properties. Following HT for example, a layer comprising zinc zirconium oxide may result, as described above with respect to any of the other embodiments herein.

In certain example embodiments, disposing or depositing a mixed layer of $Zn:ZrO_x$ via codeposition from two sputtering targets fixtures in such a manner as to produce overlapping sputtering distributions may advantageously produce temperable coatings, for example, with good antimicrobial and/or antifungal properties. In certain cases, after heat treatment/tempering, coatings made by this process may beneficially have excellent antimicrobial efficacy against both bacteria and fungi when tested in accordance with JIS Z 2801 and ASTM G21; natural, clear appearance with reduced haze, possibly also with high transmittance; improved resistance to scratching by hard objects (including, for example, glass and/or ceramic spheres) as compared to uncoated glass; and/or improved chemical durability (e.g., against staining and/or the like) as compared to uncoated glass.

However, it has been found that in certain example embodiments, advantageous properties substantially similar to those may be obtained in other ways. For example, in certain cases, co-deposition of a mixed layer comprising $Zn:ZrN_x$ may also produce advantageous properties. Furthermore, deposition of at least two discrete layers (e.g., with no or substantially no mixing prior to heat treating) comprising a first ("bottom") layer of Zn metal and/or oxide, and a second ("top") layer of Zr metal, oxide, nitride, and/or oxynitride may produce some of the aforesaid advantageous properties as well. It has been advantageously found that in both of the aforesaid example embodiments, the end-product coating (e.g., after heat treating/temerping) may perform similarly to coatings produced by co-sputtering a layer comprising $Zn:ZrO_x$. In certain example situations, this may indicate that similar compositions may be produced in the heating/tempering process through diffusion, oxidation, and/or the like. These example embodiments are described in more detail below.

An example embodiment relates to the deposition of two discrete layers (e.g., with no or substantially no significant mixing prior to heating). In certain examples, a first layer of Zn, $ZnN_x$, $ZnO_x$, and/or $ZnO_xN_y$ may be deposited on a glass substrate (e.g., a coated or uncoated glass substrate) and a second layer comprising Zr, $ZrO_x$, $ZrN_x$, and/or $ZrO_xN_y$ may be deposited on the Zn-inclusive layer. In certain examples, the first layer may advantageously be of or include $ZnO_x$ and the second layer may be of or include $ZrN_x$. The coating may or may not include other layers above, below, and/or between the Zn- and Zr-inclusive layers. After the coating is formed, the coated article may be tempered. In certain instances, the tempering may cause diffusion and/or oxidation, and a $Zn:ZrO_x$ matrix may be formed, e.g., in connection with a single layer produced from two discrete layers.

In some cases, the composition of a coating formed by discrete deposition may have a similar composition to a coating made by co-sputtering. Accordingly, in certain example embodiments, an antifungal/antimicrobial coating formed by discretely depositing the Zn and Zr based layers may perform similarly to coatings produced by co-sputtering.

Figure 9:
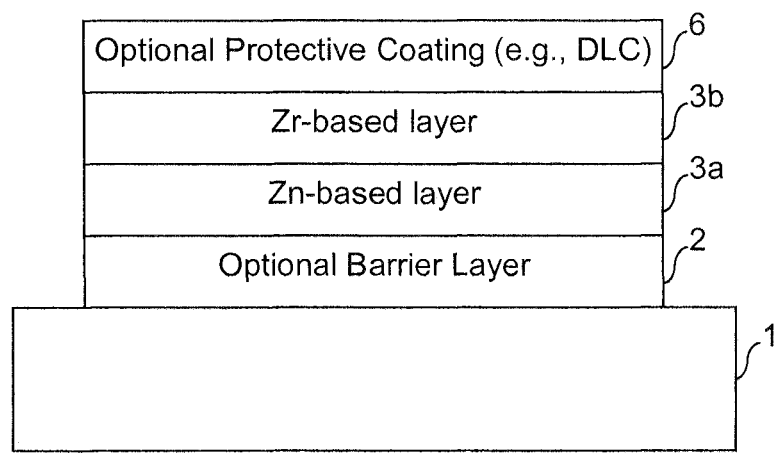
FIG. 9 illustrates a scenario in which Zn- and Zr-inclusive layers are initially formed discretely, but ultimately result in a combined single layer after heat treatment in accordance with certain example embodiments.

FIG. 9 illustrates a scenario in which Zn- and Zr-inclusive layers are initially formed discretely, but ultimately result in a combined single layer after heat treatment in accordance with certain example embodiments. The coated article may include a glass substrate 1, an optional barrier layer 2 (which may by a silicon-inclusive layer such as, for example, a layer comprising SiOx, SixNy, SiOxNy, etc., in certain examples), and discrete layers 3a and 3b, which are the precursor to layer 3 as shown, for example, in FIG. 1. In some cases, optional layer 2 may be from about 10 to 20,000 Å thick, more preferably from about 50 to 10,000 Å thick, and most preferably from about 100 to 1,000 Å in thickness.

Discrete layer 3a is deposited over the glass substrate (and optional barrier layer 2, when layer 2 is present). Discrete layer 3a may comprise or consist essentially of Zn, $ZnN_x$, $ZnO_x$, and/or $ZnO_xN_y$ in certain example embodiments. In certain cases, when layer 3a comprises $ZnO_x$, x may be less than 1 or 2. In other words, layer 3a may comprise or consist essentially of Zn, zinc nitride, zinc oxynitride, and/or a sub-oxide of Zn in certain exemplary embodiments. In some cases, layer 3a may have a thickness of from about 1 to 500 Å, more preferably from about 10 to 100 Å, and most preferably from about 20 to 50 Å.

Discrete layer 3b may be deposited over layer 3a in some embodiments. Layer 3b may comprise or consist essentially of Zr, $ZrN_x$, $ZrO_x$, $ZrO_xN_y$, and/or according to different example embodiments. In certain cases, layer 3b may have a thickness of from about 10 to 2,500 Å, more preferably from about 50 to 150 Å, and most preferably from about 100 to 250 Å.

In certain example embodiments, the coating may further comprise a protective overcoat (layer 6). In some instances, the protective overcoat may be of or include diamond-like carbon (DLC). In certain examples, the optional protective overcoat may have a thickness of from about 1 to 1000 Å, more preferably from about 10 to 200 Å, and most preferably from about 20 to 100 Å. A layer comprising DLC may be disposed (e.g., as an outermost layer) before or after heat treating in certain example embodiments.

FIG. 9 as described above illustrates an example composition of an antimicrobial/antifungal coating prior to tempering and/or heat treatment. In certain example embodiments, after tempering and/or heat-treatment, the coating will no longer have the same structure described in FIG. 9. In certain examples, after heating, layers 3a and 3b may diffuse and/or oxidize to form layer 3 (e.g., from FIG. 1).

In certain example embodiments, discrete layer deposition may provide manufacturability advantages over co-deposition. In some instances, co-deposition and/or alternative co-deposition can be significantly more complex than discrete layer deposition. For example, multiple targets may need to be installed in the same deposition bay such that their sputtering fluxes overlap. In some situations, the ability to do this may be limited by available space. Thus, in some cases, co-deposition may require more complex equipment and/or more space. Furthermore, in certain cases, there may be interactions between the targets in close proximity when they have differing compositions. In some cases, those interactions may not be desirable. Additionally, common reactive gas loading may make independent control of each target difficult. Accordingly, it has been found that in certain example embodiments, it may be advantageous to deposit the layers discretely rather than at the same time. However, in other embodiments, the layers may be co-deposited.

Again, in any of the above embodiments, metal or ceramic targets can be used. The targets may be planar targets or rotating cylindrical magnetron sputtering targets, or a combination thereof.

The deposition method of zinc zirconium oxide is not limited to the above embodiments. Any deposition method may be used that results in the appropriate structure and composition of the zinc zirconium oxide-based layer.

The ratio of zirconium to zinc (not including any oxygen that may be present) in the layer comprising zinc zirconium oxide in any example embodiment of this invention can be from about 2.5 to 200 in example embodiments, more preferably about 3.33 to 100, and most preferably from about 6.67 to 50. Deposition may take place in the presence of oxygen, argon, and/or other gases. The oxygen flow rate used in sputter-depositing the zinc oxide and/or zirconium oxide may be between about 8 and about 28 sccm in certain example embodiments; more preferably from about 13 to 23 sccm; and most preferably from about 16 to 21 sccm. If argon is present, the argon flow rate used in sputter-depositing the zinc oxide and/or zirconium oxide may be from about 10 to 200 sccm, more preferably from about 25 to 175 sccm, and most preferably from about 50 to 150 sccm. However, the composition of each layer may depend on power in addition to oxygen flow rate, in some cases. It is noted that although zirconium oxide and zinc oxide may be expressed as $ZrO_2$ and ZnO respectively, and the layer formed may be expressed as being of or comprising $Zn_xZr_yO_z$, the layer and/or coating is not necessarily fully oxidized and stoichiometric. Partial oxidation and full oxidation of this layer and/or coating are possible. More or less oxygen will be present in the layer depending on several factors, including the oxygen flow rate during deposition.

The layer formed may have the formula zinc zirconium oxide. Before and/or after heat treatment, in the layer comprising zinc zirconium oxide the zinc may constitute from about 0.25% to 15% (atomic) of the layer, more preferably from about 0.5% to 10%, and most preferably from about 1% to 8% of the layer. Before and/or after HT, the zirconium may constitute from about 20% to about 50% (atomic) of the layer comprising zinc zirconium oxide, more preferably about 25% to 45%, and most preferably from about 30% to 40% of the layer. Before and/or after HT, the oxygen may constitute from about 40% to 80% (atomic) of the layer comprising zinc zirconium oxide, more preferably from about 50% to 70% of the layer, and most preferably from about 55% to about 65% of the layer. These ranges are advantageous because, for example and without limitation, if the zinc concentration is too low, there will be insufficient zinc at the surface to adequately inhibit fungal and/or bacterial growth, and if the zinc concentration is too high, the chemical stability and environmental durability of the coating will degrade.

EXAMPLES

Table 2 illustrates the results of several example coatings that were tested for their antimicrobial activity against *E. coli*, as well as for scratch resistance. Table 2 indicates that there may be a connection between improved antimicrobial activity and improved scratch resistance.

TABLE 2

| Example | Escherischia coli CFU (colony forming units) | | | Average CFU recovered | Average % reduction | Antimicrobial activity | Scratch resistance |
|---|---|---|---|---|---|---|---|
| | a | b | c | | | | |
| 1 | $3.46 \times 10^6$ | $4.02 \times 10^6$ | $3.70 \times 10^6$ | $3.73 \times 10^6$ | N/A | N/A | 0.2 |
| 2 | <10 | <10 | <10 | <10 | >99.99 | 5.57 | 9.0, 21.0 |
| 3 | <10 | <10 | <10 | <10 | >99.99 | 5.57 | 12.1 |
| 4 | $1.17 \times 10^3$ | $2.05 \times 10^2$ | $3.63 \times 10^2$ | $5.79 \times 10^2$ | 99.98 | 3.81 | 5.7 |
| 5 | $5.49 \times 10^3$ | $2.63 \times 10^3$ | $8.63 \times 10^3$ | $5.58 \times 10^3$ | 99.95 | 2.83 | 1.5 |

The antimicrobial test results illustrated in Table 2 were carried out following the Japanese Industrial Standard Test for Antimicrobial Activity and Efficacy in Antimicrobial Products (JIS Z 2801) procedure. This procedure is designed to quantitatively evaluate the antimicrobial effectiveness of agent(s) incorporated or bound into or onto substantially flat (e.g., two-dimensional) hydrophobic or polymeric surfaces. The test organism was Escherichia coli ATCC 8739 (E. coli). The sample size was approximately 2" by 2". The inoculum volume was approximately 0.40 mL, and the recovery media was trypticase soy agar.

The glass samples (e.g., Examples 1-5) were inoculated with 0.4 mL of a 0.2% nutrient broth with a standardized culture of the test organism. The bacterial resistance was tested against Escherichia coli and tested in triplicate. The inoculated samples were covered with an inert film and incubated at 35+/−2° C. in a humidity chamber for 24 hours. The untreated sample, Example 1, was designated as a control to recover viable cell counts immediately after inoculation. Surviving microorganisms were recovered via elution of the broth inoculum from the test sample into neutralizing broth, and the number of them was determined using serial dilution method.

The CFU of E. coli were determined using triplicate samples, a, b, and c. Table 2 illustrates the antimicrobial activity results after 24 hours. Example 1, the control sample, was tested at both T=0 and T=24. At T=0, the average amount of viable bacteria was $2.31 \times 10^5$ CFU.

The "Average Percent Reduction" shown in Table 2 was calculated according to the following formula:

$$\text{Average Percent Reduction} = \frac{\text{Avg. viable bacteria in Example 1 @ } T=24 - \text{Avg. viable bacteria in Example } X \text{ @ } T=24}{\text{Avg. viable bacteria in Example 1 @ } T=24}$$

The Antimicrobial Activity was calculated according to the formula:

$$\text{Antimicrobial Activity} = [\log B/C], \text{ where}$$

B=Number of viable bacteria at T=0 on untreated sample (control—Example 1)
C=Number of viable bacteria at 24 hours on each Example Overall, Examples 2 and 3 were found to have significant antimicrobial activity against Escherichia coli bacteria in the JIS Z 2801:2000 test. Examples 4 and 5 were found to have some antimicrobial activity against Escherichia coli. Example 1, the untreated glass substrate used as a control, did not show any antimicrobial activity against the organism.

TABLE 3

| Ex. | Si3N4 | ZnZrNx | Zn | ZrNy | N flow/Power |
|---|---|---|---|---|---|
| 1 | N/A | N/A | N/A | N/A | N/A |
| 2 | 40 Å | 150 Å | N/A | N/A | 15 sccm $N_2$ 0.19 kW(Zn) 1.5 kW(Zr) |
| 3 | 1500 Å | N/A | 40 Å | 120 Å | $30N_2$, 2 kW |
| 4 | 1500 Å | N/A | 20 Å | 120 Å | $30N_2$, 2 kW |
| 5 | 1500 Å | N/A | 20 Å | 120 Å | $15N_2$, 2 kW |

Table 3 describes the composition of the Example coatings, and some process conditions under which they were formed. Example 1 was an uncoated glass substrate (e.g., the control), and Example 2 comprised a co-deposited ZnZr-based layer. Examples 3-5 each comprised two discrete layers of Zn and Zr, respectively.

Example 2, as seen above, comprised a layer formed via co-deposition with nitrogen. Example 3, on the other hand, involved depositing a zinc-based layer and then a zirconium nitride-based layer. Both Example 2 and Example 3 had very good results. This may indicate that in certain example embodiments, co-sputtering and the formation of discrete layers may be substantially equally advantageous. In view of this, in some cases it may be more desirable to form discrete layers rather than co-sputtering the coating, as this may be more feasible commercially and may still produce substantially similar results in terms of antimicrobial activity against E. coli, for example.

The thicknesses of the Zn- and Zr-based layers, respectively, were the same in Examples 4 and 5. Furthermore, the Zn- and Zr-based layers in Examples 4 and 5 were deposited with the same power. The only difference between the two examples was that Example 5's Zr-based layer was deposited with more $N_2$ in the atmosphere. From Examples 4 and 5, it was found that when the layers were deposited with process conditions including 30 sccm N2 (and 2 kW power), there were fewer CFUs than when layers of the exact same thicknesses were deposited with the same power but 15 sccm $N_2$. Thus, in certain example embodiments, a higher flow rate of N (e.g., more N present in the deposition chamber) may advantageously lead to better antimicrobial properties. In certain example embodiments, depositing the ZrNx-based layer in an atmosphere using a nitrogen flow rate of at least about, but more preferably greater than 15 sccm (e.g., at least about 20, or even 30 sccm $N_2$) may advantageously result in a coating with better antimicrobial properties. However, in other examples, the layer thickness may also be a factor in achieving good performance.

Examples 4 and 5, in addition to illustrating the possible relationship between antimicrobial properties and nitrogen flow rate, also illustrate that the ratio between Zr and Zn may have an effect on the antimicrobial properties of a coating. Examples 4 and 5 included coatings having thinner zinc-based layers. Examples 4 and 5 also had lower antimicrobial activity against *E. coli* (e.g., there were more colony forming units on the substrate at the end of the test than in Examples 2 and 3). In certain example embodiments, coatings with thinner zinc-based layers that are formed by discrete layers oxidizing and diffusing upon heating may still have antimicrobial properties. These antimicrobial properties may not be quite as good as those when co-sputtering or discrete layer deposition with thicker layers of zinc is used in some examples, although they still may be effective against some bacteria and fungi. In certain cases, this may indicated that the zinc:zirconium ratio is an important variable that impacts performance.

In certain example embodiments when the antimicrobial/antifungal coating is formed via discrete layer deposition, the ratio of thickness of the Zn-based layer to the Zr-based layer may be at least about 1:6, more preferably at least about 1:4.8, even more preferably at least about 1:4, and most preferably at least about 1:3. However, in other example embodiments, other thickness ratios may be used. Particularly, other ratios may be used so long as the antimicrobial activity against *E. coli* and/or other bacteria and/or fungi is sufficiently reduced.

Furthermore, it has advantageously been found that in certain example embodiments, silver, copper, and/or mixtures thereof may be added to or included in the zinc zirconium oxide-based layer used for both co-sputtering and discrete layer deposition with substantially similar antimicrobial properties. For example, some of the zinc in the zinc zirconium oxide-based layer may be replaced with one or more of silver, copper, titanium and/or the like. In further examples, the aforesaid materials may substantially replace the zinc in layer 3.

The thickness of the layer comprising zinc zirconium oxide described in the above embodiments can be from about 10 to 1000 Å in certain example embodiments, more preferably from about 200 to 800 Å, most preferably from about 400 to 600 Å, with an example thickness being about 550 Å in an example embodiment.

The layer described in the above embodiments is not limited to zinc, zirconium, and oxygen. Other materials may be present in this layer, and other layers may be provided over or under the zinc zirconium oxide-based layer. However, in certain example embodiments, the layer may comprise, consist essentially of, or consist of, $Zn_xZr_yO_z$.

In certain example embodiments of this invention, a method of making a coated article is provided. A first sputtering target comprising Zr, and a second sputtering target comprising Zn are provided. A first discrete layer comprising Zn is formed on a glass substrate via the first sputtering target. A second discrete layer comprising Zr is formed over and contacting the layer comprising Zn. The first and second discrete layers are heat treated (e.g., together at substantially the same time) to produce a single layer comprising $Zn_xZr_yO_z$.

In addition to the features of the previous paragraph, the first layer may comprise ZnOx prior to heat treatment and/or the second layer may comprise ZrNx prior to heat treatment.

In addition to the features of the previous paragraph, the second layer comprising Zr may be deposited in the presence of nitrogen.

In addition to the features of the previous paragraph, a nitrogen flow rate for at least a portion of the deposition of the layer comprising Zr may be at least about 15 sccm, more preferably at least about 30 sccm.

In addition to the features of the paragraph four above this paragraph, in certain example embodiments, the first layer may comprise ZnOx and the second layer may comprise ZrNy prior to heat treatment.

In addition to the features of any one of the five preceeding paragraphs, a ratio of a thickness of the Zn-based layer to that of the Zr-based layer may be at least about 1:6, more preferably at least about 1:4.

In addition to the features of any one of the six preceeding paragraphs, an antimicrobial activity of the coated article (where antimicrobial activity=[log B/C], where B=number of viable bacteria at T=0 on an uncoated substrate and C=number of viable bacteria at T=24 hours on the coated article) may be at least about 2, more preferably at least about 3, and still more preferably at least about 5.

In addition to the features of any one of the seven preceeding paragraphs, the first target may be located or housed in a first deposition chamber and the second target may be located or housed in a second deposition chamber.

In certain example embodiments of this invention, a method of making a coated article is provided. A first sputtering target comprising Zr and a second sputtering target comprising Zn are provided. At least the first and second sputtering targets are co-sputtered in the presence of nitrogen to form a layer comprising $Zn_xZr_yN_z$ on a glass substrate. The layer comprising $Zn_xZr_yN_z$ is heat treatable such that, when heat treated, the layer comprising $Zn_xZr_yN_z$ forms a layer comprising $Zn_xZr_yO_z$ having antimicrobial and/or antifungal properties. In certain example embodiments, after heating, the layer comprising $Zn_xZr_yO_z$ may further comprise nitrogen.

In addition to the features of the previous paragraph, the layer comprising $Zn_xZr_yN_z$ may be heat treated to form a layer comprising $Zn_xZr_yO_z$ including from about 0.5% to 10% (atomic) Zn, from about 25% to 45% (atomic) Zr, and from about 50% to 70% (atomic) O; more preferably including from about 1% to 8% (atomic) Zn, from about 30% to 40% (atomic) Zr, and from about 55% to 65% (atomic) O after thermal tempering.

In addition to the features of the previous paragraph, an antimicrobial activity of the coated article (where antimicrobial activity=[log B/C], where B=number of viable bacteria at T=0 on an uncoated substrate and C=number of viable bacteria at T=24 hours on the coated article) may be at least about 5.

In addition to the features of either of the two previous paragraphs, the first layer may comprise ZnOx.

In addition to the features of any one of the three previous paragraphs, a flow rate of nitrogen during at least part of the deposition of the layer comprising Zr may be at least about 15 sccm.

In certain example embodiments of this invention, a method of making a coated article is provided. A first sputtering target comprising Zn, and a second sputtering target comprising Zr are provided. Sequentially sputtering is performed from at least the first and second sputtering targets onto a glass substrate to form at least a first layer comprising Zn having a thickness of from about 20 to 50 Å, and a second layer comprising Zr located directly on the first layer comprising Zn and having a thickness of from about 100 to 250 Å. The Zr is sputtered in the presence of nitrogen. The glass substrate is heat treatable with said first and second layers thereon to form a layer comprising zinc zirconium oxide with antibacterial and/or antifungal properties on the coated article.

This coating and glass making up the coated article may or may not be heat treated in certain example embodiments.

The terms "heat treatment" and "heat treating" as used herein mean heating the article to a temperature sufficient to enabling thermal tempering, bending, and/or heat strengthening of the glass. This includes, for example, heating an article to a temperature of at least about 580 or 600 degrees C. for a sufficient period to enable tempering and/or heat strengthening.

In certain example embodiments, co-sputtered zirconium and zinc oxides result in a zinc zirconium oxide-based layer that exhibits excellent scratch resistance, combined with antibacterial and/or antimicrobial properties. In a simple scratch test where a 1/8" diameter borosilicate sphere is dragged across the surface of the coated article, the load which causes a visible scratch on the coated surface can be as high as 10, 15 or 20 pounds. In comparison, uncoated glass fails this test at less than 0.5 pounds. The layer comprising zinc zirconium oxide can pass a 10 lb., 15 lb., and/or 20 lb. scratch test with borosilicate sphere without being scratched in certain example embodiments of this invention. In certain example embodiments, the scratch resistance may be increased to a level higher than uncoated glass.

Although certain example embodiments have been described as including an anti-microbial agent (e.g., Zn, Ag, Cu, etc.) within a Zr carrier material, other carrier materials may be used in different embodiments of this invention. Si, Ti, Hf, Al, and/or any other suitable carrier medium may be used in connection with different embodiments of this invention. In general, any one or more suitable binder materials may be used in connection with any one or more anti-microbial agents.

Although certain example embodiments have been described as including co-sputtering from two targets, other example embodiments may include sputtering two or more materials from a mixed target. For instance, certain example embodiments may involve sputtering form a mixed metal target comprising Zn and Zr.

In certain example embodiments of this invention, there is provided a method of making a coated article comprising a glass substrate supporting a coating. The coating is sputter deposited on the substrate, with the coating comprising an anti-microbial material located within a carrier material. The anti-microbial material comprises Zn, Ag, and/or Cu. The carrier material comprises Zr, Si, Ti, Hf, and/or Al. The sputter depositing is practiced by either (a) co-sputtering from two or more targets, or (b) sputtering from a mixed metal target.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a coated article, the method comprising:
   providing a sputtering target comprising Zn and a sputtering target comprising Zr which are spaced apart from each other;
   sputter-depositing a first layer comprising Zn, so that the first layer comprising Zn is in direct physical contact with a glass substrate, via the sputtering target comprising Zn;
   sputter-depositing a second layer comprising Zr nitride over and directly physically contacting the first layer comprising Zn, so that the first layer comprising Zn is closer to the glass substrate than is the second layer comprising Zr nitride;
   wherein the first layer comprising Zn is from about 20-50 Å thick, and the second layer comprising Zr nitride is from about 100-250 Å thick; and
   heat treating the glass substrate with the first and second layers thereon to produce a heat treated coated article including a layer comprising $Zn_xZr_yO_z$, wherein the heat treating causes the first layer comprising Zn and the second layer comprising Zr nitride to transform into the layer comprising $Zn_xZr_yO_z$.

2. The method of claim 1, wherein the first layer comprises ZnOx prior to heat treatment.

3. The method of claim 1, wherein the first layer comprises ZnOx and the second layer comprises ZrNy prior to heat treatment.

4. The method of claim 1, wherein
   a ratio of a thickness of the first layer comprising Zn to that of the second layer comprising Zr nitride is at least about 1:6.

5. The method of claim 4, wherein the ratio is at least about 1:4.

6. The method of claim 1, wherein after the heat treating an antimicrobial activity of the coated article (where antimicrobial activity=[log B/C], where B=number of viable bacteria at T=0 on an uncoated substrate and C=number of viable bacteria at T=24 hours on the coated article) is at least about 2.

7. The method of claim 6, wherein the antimicrobial activity is at least about 3.

8. The method of claim 7, wherein the antimicrobial activity is at least about 5.

9. The method of claim 1, wherein the target comprising Zn is in a first deposition chamber and the target comprising Zr is in a second deposition chamber.

10. A method of making a coated article, the method comprising:
    providing a first sputtering target comprising Zn;
    providing a second sputtering target comprising Zr; and
    sequentially sputtering from at least the first and second sputtering targets onto a glass substrate to form at least a first layer comprising Zn having a thickness of from about 20 to 50 Å, and a second layer comprising Zr located directly on and contacting the first layer comprising Zn and having a thickness of from about 100 to 250 Å, wherein the Zr is sputtered in the presence of nitrogen;
    wherein the first layer comprising Zn is located directly on and directly physically contacts the glass substrate;
    heat treating the glass substrate with said first and second layers thereon to form a layer comprising zinc zirconium oxide with antibacterial and/or antifungal properties which is an outermost layer of the coated article.

11. The method of claim 10, wherein an antimicrobial activity of the coated article (where antimicrobial activity= [log B/C], where B=number of viable bacteria at T=0 on an uncoated substrate and C=number of viable bacteria at T=24 hours on the coated article) is at least about 5.

12. The method of claim 10, wherein the first layer comprises ZnOx.

13. The method of claim 10, wherein a flow rate of nitrogen during at least part of the deposition of the second layer comprising Zr is at least about 15 sccm.

14. The method of claim 1, wherein the coated article has an improved scratch resistance.

15. The method of claim 14, wherein the coated article has an improved scratch resistance such that visible scratching of the layer comprising $Zn_xZr_yO_z$ by a 1/8 inch borosilicate sphere with up to a 20 pound load is prevented.

16. The method of claim 1, wherein the coated article has improved anti-fungal properties as compared to a coated article including only silver as an anti-fungal agent.

17. A method of making a coated article, the method comprising:

having a glass substrate supporting a coating, the coating including a first sputter-deposited layer comprising Zn and a second sputter-deposited layer comprising Zr nitride over and contacting the first layer comprising Zn, the second sputter-deposited layer comprising Zr nitride being sputter-deposited using a nitrogen gas flow rate of from 15-30 sccm, so that the first sputter-deposited layer comprising Zn is closer to the glass substrate than is the second sputter-deposited layer comprising Zr nitride, and wherein the first sputter-deposited layer comprising Zn is in direct physical contact with the glass substrate;

wherein the first sputter-deposited layer comprising Zn is from about 20-50 Å thick, and the second sputter-deposited layer comprising Zr nitride is from about 100-250 Å thick; and heat treating the glass substrate with the first and second layers thereon to produce a heat treated coated article including a layer comprising $Zn_xZr_yO_z$, wherein the heat treating causes the first layer comprising Zn and the second layer comprising Zr nitride to transform into the layer comprising $Zn_xZr_yO_z$.

18. The method of claim 17, wherein the layer comprising $Zn_xZr_yO_z$ further comprises copper.

19. The method of claim 17, wherein after the heat treating an antimicrobial activity of the coated article (where antimicrobial activity=[log B/C], where B=number of viable bacteria at T=0 on an uncoated substrate and C=number of viable bacteria at T=24 hours on the coated article) is at least about 3.

20. The method of claim 1, wherein a power from 1.6 to 3.6 kW is used in sputter-deposing the first layer comprising Zn, and a power from 1.5 to 3.5 kW is used in sputter-depositing the second layer comprising Zr.

21. The method of claim 1, wherein the second layer comprising Zr nitride is sputter-deposited including utilizing a nitrogen gas flow rate of from 15-30 sccm.

* * * * *